(12) United States Patent
de Rosa

(10) Patent No.: US 11,531,047 B2
(45) Date of Patent: Dec. 20, 2022

(54) CURRENT MEASURING SYSTEM FOR A COMMUTATED MOTOR

(71) Applicant: TDK—Micronas GmbH, Freiburg (DE)

(72) Inventor: Adriano de Rosa, Badenweiler (DE)

(73) Assignee: TDK—Micronas GmbH, Freiburg (DE)

( * ) Notice: Subject to any disclaimer, the term of this patent is extended or adjusted under 35 U.S.C. 154(b) by 0 days.

(21) Appl. No.: 16/739,577

(22) Filed: Jan. 10, 2020

(65) Prior Publication Data

US 2020/0225267 A1 Jul. 16, 2020

(30) Foreign Application Priority Data

Jan. 11, 2019 (DE) ...................... 10 2019 100 638.4

(51) Int. Cl.
| | | |
|---|---|---|
| *G01R 19/165* | (2006.01) | |
| *H02P 6/28* | (2016.01) | |
| *H02P 6/14* | (2016.01) | |
| *H02M 7/5387* | (2007.01) | |

(52) U.S. Cl.
CPC .. *G01R 19/16519* (2013.01); *H02M 7/53871* (2013.01); *H02P 6/14* (2013.01); *H02P 6/28* (2016.02)

(58) Field of Classification Search
CPC .. H02P 6/085; H02P 7/04; H02P 27/08; H02P 27/05; H02P 27/06; H02P 21/00; H02M 7/527; H02M 1/4233; H02M 7/162; H02M 7/219; H02M 7/521; H02M 2007/53876

See application file for complete search history.

(56) References Cited

U.S. PATENT DOCUMENTS

| | | | | |
|---|---|---|---|---|
| 5,877,950 | A | 3/1999 | Bonsignour et al. | |
| 6,288,507 | B1 * | 9/2001 | Makino | H02P 7/29 |
| | | | | 318/292 |
| 6,653,812 | B1 * | 11/2003 | Huo | H02M 7/53875 |
| | | | | 318/801 |
| 8,050,543 | B2 * | 11/2011 | Katyal | H02M 7/53875 |
| | | | | 318/400.11 |
| 9,707,993 | B2 * | 7/2017 | Kumagai | H02P 23/00 |
| 2005/0248361 | A1 * | 11/2005 | O'Gorman | H02P 3/22 |
| | | | | 324/765.01 |
| 2008/0265829 | A1 * | 10/2008 | Hayashi | H02P 21/26 |
| | | | | 318/781 |
| 2011/0062934 | A1 * | 3/2011 | Wolf | H02M 7/48 |
| | | | | 323/304 |
| 2014/0112801 | A1 | 4/2014 | Kozaki | |
| 2014/0312818 | A1 * | 10/2014 | Furuchi | H02P 6/14 |
| | | | | 318/400.29 |

(Continued)

FOREIGN PATENT DOCUMENTS

| | | |
|---|---|---|
| DE | 3712185 A1 | 10/1987 |
| DE | 10248375 A1 | 5/2003 |
| WO | 2005074115 A1 | 8/2005 |

*Primary Examiner* — Bickey Dhakal
(74) *Attorney, Agent, or Firm* — 24IP Law Group USA, PLLC; Timothy DeWitt

(57) ABSTRACT

A current measuring system (10) for a commutated motor (20). The current measuring system comprises a bridge circuit (30) with several branches (30*a-c*), wherein the branches (30*a-c*) are in each case connected to commutation blocks of the commutated motor (20), and the branches (30*a-c*) each have a current measuring circuit (60*a-c*).

5 Claims, 3 Drawing Sheets

(56) References Cited

U.S. PATENT DOCUMENTS

| | | | |
|---|---|---|---|
| 2015/0077025 A1* | 3/2015 | Suzuki | B62D 5/046 318/400.02 |
| 2016/0254760 A1 | 9/2016 | Zhang et al. | |
| 2017/0179868 A1* | 6/2017 | Suzuki | H02P 29/50 |
| 2018/0115254 A1* | 4/2018 | Qian | H02M 1/08 |

* cited by examiner

CURRENT MEASURING SYSTEM FOR A COMMUTATED MOTOR

CROSS REFERENCE TO RELATED APPLICATIONS

This application claims benefit of and priority to German Patent Application No. DE 10 2019 100 638.4, filed on 11 Jan. 2019. The disclosure of this German patent application is incorporated in its entirety herein by reference.

BACKGROUND OF THE INVENTION

Field of the Invention

The invention relates to a system and method for measuring current in a commutated motor.

Brief Description of the Related Art

Commutated motors are electrical motors without contact brushes. No immediate electrical contact exists between a mobile rotor of the electrical motor and the stationary stator of the motor. The commutated motors use electrical switches for enabling the commutation of the current from one commutation block to the next commutation block in the stator. Such electrical switches are usually formed in an H bridge circuit with two branches for a single-phase electrical motor and, in a three-phase bridge circuit, with three branches for a three-phase motor.

The branches of the bridge circuits are connected in each case to two of the commutation blocks of the electrical motor. In one embodiment, the branches of the bridge circuits have two field-effect transistors. The gates of the field-effect transistors are connected to a switching element which applies a voltage to the gates to thus switch on the field-effect transistors over a defined time interval and enable flow of the current in the corresponding commutation blocks of the commutated motor.

In the bridge circuits known in the art, the current is measured by a simple shunt (measuring or shunt resistor). Particularly during the sector transitions in the vector driving of the commutated motor, this simple current measurement is incomplete, since the shunt does not permit a phase current measurement, and is thus not exploitable for the regulation of, for example, small motors.

In the past, the commutated small motors with vector drive were rarely installed in motor vehicles due to the costs of the electronics (sensors and microprocessor) and of the software. In electrical vehicles, such commutated small motors would have the advantage that the commutated small motors are relatively quiet and use little electrical power. As a result, these commutated small motors are more frequently installed nowadays in such electrical vehicles (and also in other vehicles).

These installed commutated small motors are implemented by means of a so-called "six-step" commutation (or block commutation). This type of commutation is easy to implement, but it needs high flows of current in a start-up process and has a relatively high level of noise. In hybrid cars or electrical cars without a combustion engine this high noise level is noticeable.

Other types of commutation are known which have less torque ripples and are therefore quieter. One example is the field-oriented control of the commutation blocks in the commutated motor. This type of control requires an exact acquisition of the current and voltage values in the branches of the bridge circuit, which is impossible with the conventional shunt measuring systems, for example with a single-shunt measurement at the base point of the bridge circuit.

SUMMARY OF THE INVENTION

In a preferred embodiment the present invention is a current measuring system and a method measuring the current for commutated motors.

The current measuring system of this document comprises a bridge circuit with a plurality of parallel branches, wherein the branches are connected to commutation blocks of the commutated motor. The branches of the bridge circuit have a current measuring circuit and have a first switching element in a high-side of the bridge circuit and a second switching element in a low-side of the bridge circuit, One of the gates of the first switching element and one of the gates of the second switching element in the same branch are connected with one of a plurality of pulse-width modulators. This current measuring circuit permits the acquisition of the values of the phase current in the connected one of the branches of the bridge circuit and can deliver these phase current values to a control device which drives the commutated motor.

The current measuring system has a plurality of pulse-width modulators for driving switching elements in the corresponding branches of the bridge circuit. The switching elements are, for example, field-effect transistors and switch the current on and off in the branches of the bridge circuit.

The current measuring circuit is connected to an analog-digital converter which generates digital values of the measured current and passes these digital values on to the control device.

The driving of the commutated small motors is, for example, improved by the current measuring system of the present invention during the start-up phase. Moreover, disturbances by electromagnetic stray fields are reduced. The current measuring system also permits an improved diagnosis of the mode of operation of the commutated small motors due to the high number of measured values acquired.

In one aspect of the current measuring system, the current measuring circuits are arranged only in a so-called "low side" of the bridge circuit with the three branches. This arrangement permits the acquisition of the values of only the currents flowing in two branches of the three branches of the bridge circuit. The value of the flowing current in the further (third) branch is computed. In a further aspect, further ones of the current measuring circuits can also be present in a "high side" of the bridge circuit. These further current measuring circuits supply even more precise data about the flowing currents in the branches of the bridge circuit.

DESCRIPTION OF THE DRAWINGS

The invention will now be explained in more detail with reference to the figures.

DETAILED DESCRIPTION OF THE INVENTION

Figure 1:
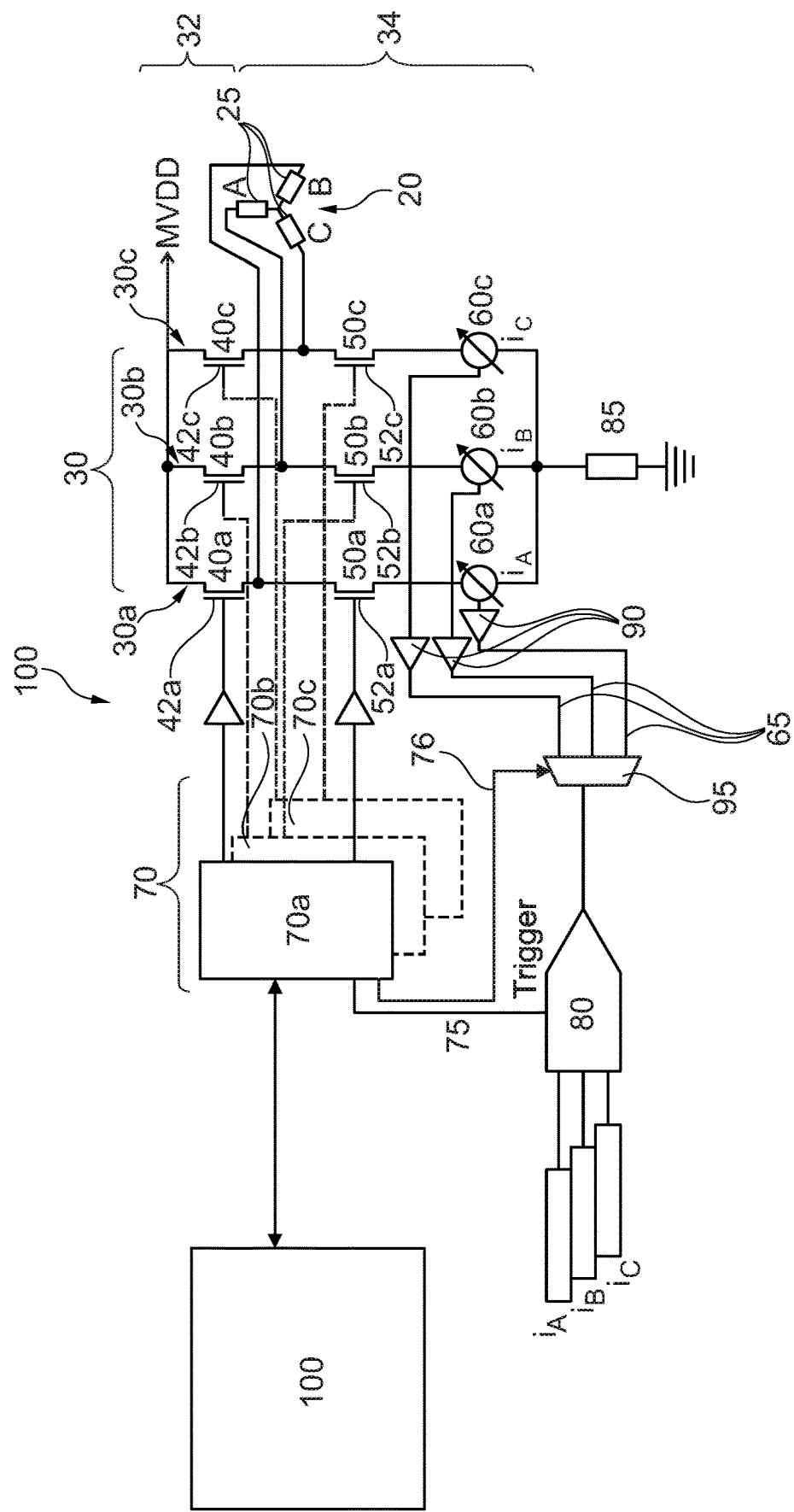
FIG. 1 shows a circuit diagram of the current measuring system.

A current measuring system 10 for a commutated motor 20 with a rotor and stator is shown in FIG. 1. The rotor and stator are not shown in FIG. 1 for reasons of clarity. The commutated motor 20 has commutation blocks 25 and is connected to a bridge circuit 30. In this aspect of the invention, the commutates motor 20 is a three-phase commutated motor 20 and the bridge circuit 30 has accordingly three branches 30a-c which are arranged in parallel (also referred to as half bridges). One of the branches 30a-c is connected to one of the commutation blocks 25 of the commutated motor 20 via lines 25a-c, as can be seen in FIG. 1. The commutated motor 20 is controlled on the basis of a method according to the principle of space vector modulation (SVM=space vector control). The commutated motor 20 may also comprise sensors (not shown), such as Hall sensors or TMR sensors, which capture the position of the rotor.

The branches 30a-c of the bridge circuit 30 have first field-effect transistors 40a-c (in a so-called "high side" 32 of the bridge circuit 30) and second field-effect transistors 50a-c (in a so-called "low side" 34 of the bridge circuit 30). One of the first field-effect transistors 40a-c is arranged with one of the of the second field-effect transistors 50a-c serially in one of the branches 30a-c between a supply line MVDD and a ground line (via a resistor 85). One of the gates 42a-c of the first field-effect transistors 40a-c and one of the gates 52a-c of the second field-effect transistors 50a-c in the same branch 30a-c are connected to one of a plurality of pulse-width modulators 70a-c. Applying a voltage at the gates 42a-c of the first field-effect transistors and at the gates 52a-c of the second field-effect transistors 50a-c switches on the corresponding first field-effect transistor 40a-c and the corresponding second field-effect transistor 50a-c. Thus, a current flows in the branch 30a-c with the switched on first field-effect transistor 40a-c and the corresponding second field-effect transistor 50a-c and thus to the connected commutation block 25 of the commutated motor 20.

In the low side 34 of the branch 30a-c a current measuring circuit 60a-c is present. In FIG. 1 this current measuring circuit 60a-c is arranged between the second field-effect transistor 50a-c and the common resistor 85, but this position is not limiting for the invention. The common resistor 85 is also connected to ground (0V) and functions as a shunt or measuring resistor. The common resistor 85 is not absolutely necessary and can be omitted. The current measuring circuit 60a-c accordingly measures the value of the flowing current $i_A$, $i_B$, $i_C$ in the branch 30a-c in which the current measuring circuit 60a-c is disposed. The outputs of the current measuring circuits 60a-c are connected via lines 65 and a multiplexer 95 to an analog-digital converter 80 which converts the values of the current measuring circuits 60a-c into a digital value. The multiplexer 95 is switched by a signal from the pulse-width modulators 70a-c via a line 76.

In a different aspect of the invention, the current measuring circuits 60a-c can also be inserted in the high side 34 of the bridge circuit 30. The current measuring circuits in the high side 34 would deliver additional information and permit a faster derivation of the current values $i_A$, $i_B$ and $i_C$ in the corresponding branch 30a-c. However, this faster derivation is not necessary for many applications.

The current measuring circuits 60a-c are configured, for example, as current mirrors.

The analog-digital converter 80 is connected via a line 75 to the pulse-width modulators 70a-c and accordingly controls the branch 30a-c in which current flows and is measured. The analog-digital converter 80 receives a trigger signal from the pulse-width modulators 70a-c upon switching on the first field-effect transistors 40a-c and the second field-effect transistors 50a-c, which initiate the measuring process. The measured values are sent to a control device 100 which is connected to the pulse-width modulators 70a-c and which controls the control process for the current measuring system 10.

A method for measuring the current in each branch will now be explained on the basis of FIGS. 2 and 3. It is known that the sum of the currents is zero under the assumption of a balanced motor 30, i.e.

$i_A + i_B + i_C = 0$

Accordingly, not all currents in each branch 30a-c have to be measured. In a balanced motor 30 all phase resistances and all phase inductances are considered to be substantially equal.

Figure 3:
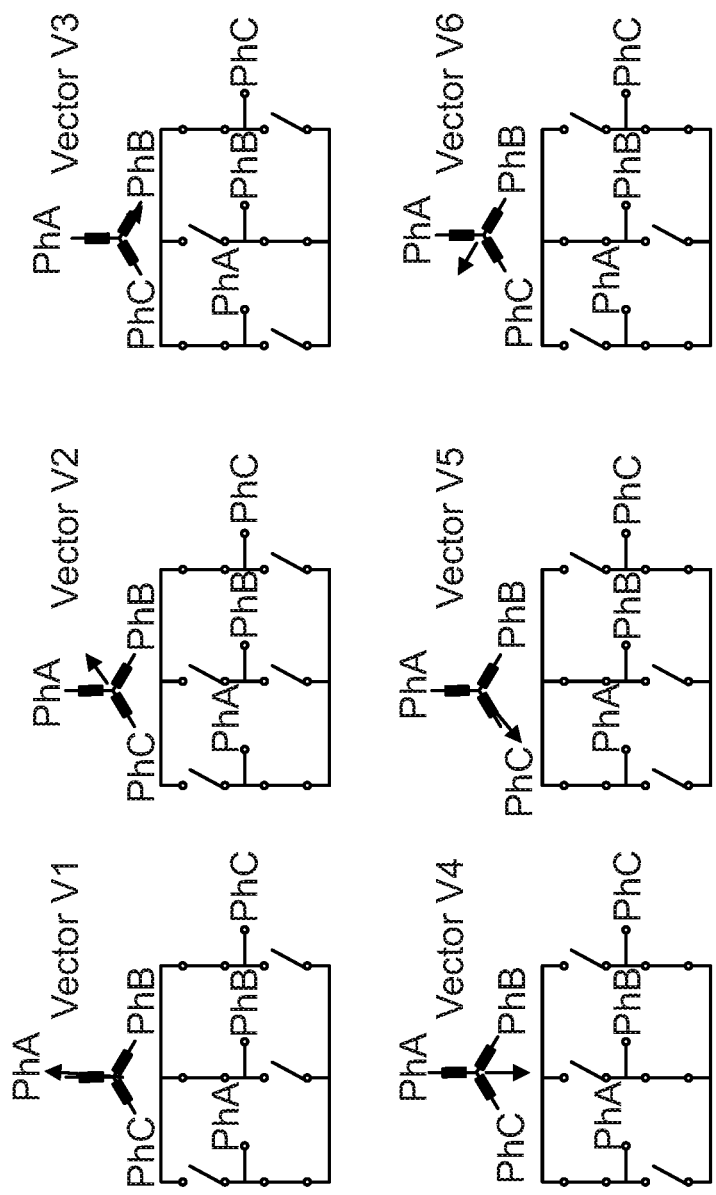
FIG. 3 shows the switching states of the field-effect transistors.
Figure 3:
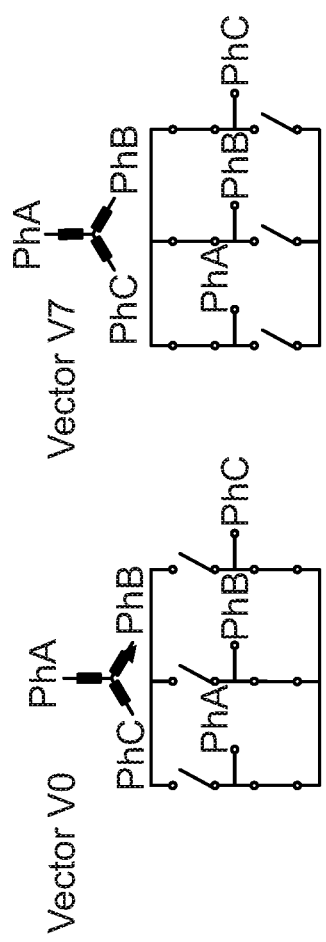
Figure 2:
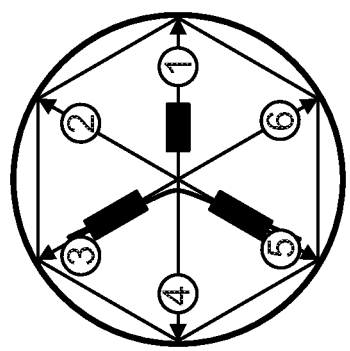
FIG. 2 shows a space vector diagram.

FIG. 3 shows the switching states for the first field-effect transistors 40a-c and the second field-effect transistors 50a-50c in the space vector modulation which is shown in FIG. 2. For example, in the case of the space vector or vector V1, the second field-effect transistor 50a and the first field-effect transistors 40b and 40c are conductive. The current measuring circuit 60a (FIG. 1) can measure the current $i_A$ through the second field-effect transistor 50a, but the current measuring circuits 60b and 60c measure no currents, since no current flows through the field-effect transistors 60b and 60c. In the case of the vector V2, in contrast, the second field-effect transistors 50a and 50b are conductive and accordingly the current measuring circuits 60a and 60b can measure the corresponding currents $i_A$ and $i_B$. The value $i_C$ can be computed based on the above equation. A similar principle can be applied to all of the other vectors V3-V6.

FIG. 3 also shows the so-called vectors V0 and V7, in the case in which none of the branches 30a-c conducts any current. These vectors V0 and V7 permit derivation of a space vector u at any angle α. This principle will now be explained in more detail on the basis of FIGS. 4A and 4B.

Figure 4B:
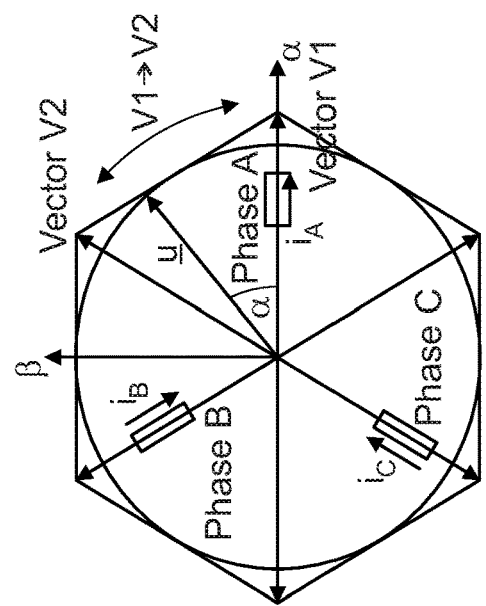
FIG. 4B shows a space vector diagram at the sector transition.
Figure 4A:
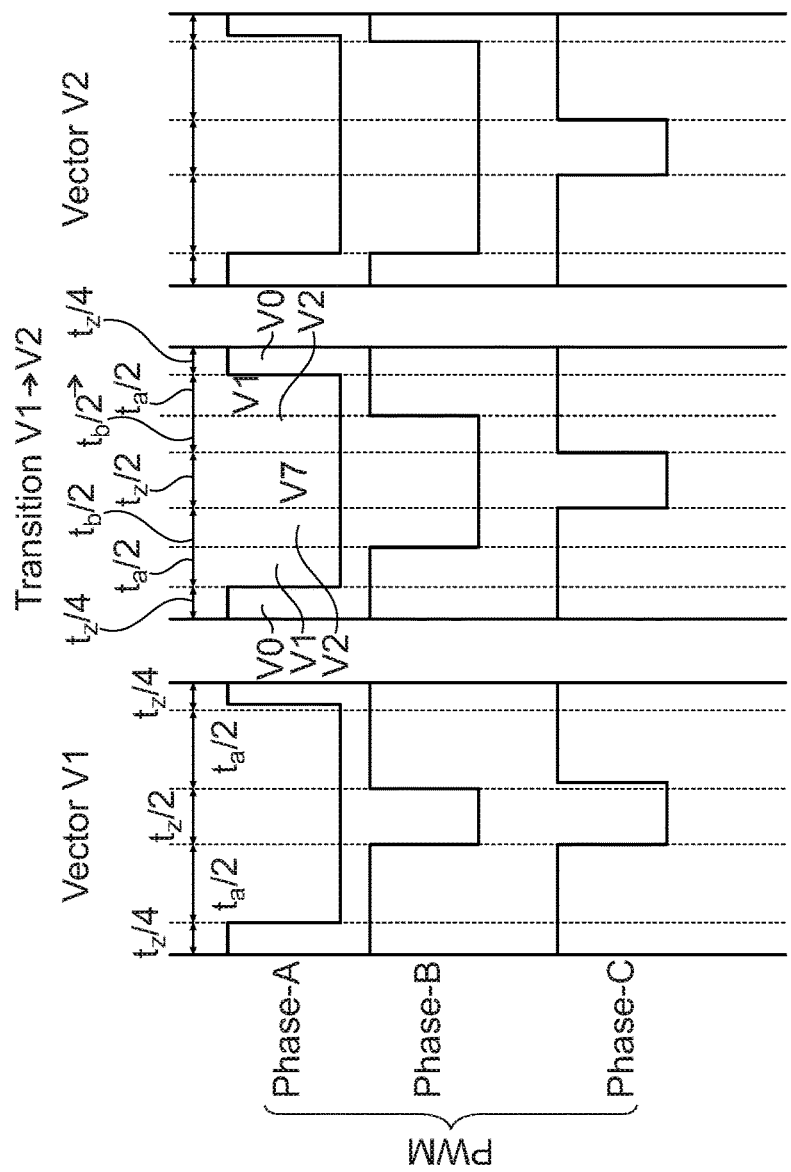
FIG. 4A shows the sector transition from one space vector to another space vector.

FIG. 4A shows the space vector diagram already known from FIG. 2. In FIG. 4A the applied voltages are captured via a PWM cycle from the connected pulse-width modulator 70a-c at the second field-effect transistors 50a-50c by measuring the corresponding currents $i_A$, $i_B$, und $i_C$ of the low end 34. In the case of the vector V1, no voltage is applied at the second field-effect transistor 50a. In the case of the vector V2, no voltages are applied at the second field-effect transistors 50a and 50b. It can be seen in FIG. 4A that the "zero vector" V0 at the start and at the end of the PWM cycle is applied for a short period of time tz/4 (i.e. t2/2 in total), in order to increase the voltage in all three branches 30a-c for the first part and the last part of the PWM cycle, so that no current flows in the branches 30a-c. In the same PWM cycle there is also applied the zero vector V0 for the period of time tz/2. The values tz/2 and also $t_A$ and $t_B$ are stored in a look-up table for the corresponding angle α. The values tz/2, $t_A$ and $t_B$ can likewise be computed from the value of cos/sin α. The sine value and/or the cosine value of α can also be stored in a look-up table.

The transition between the vector V1 and the vector V2 is shown in FIG. 4B. It is assumed that the vector u is to be constructed at the angle α, as shown in FIG. 4B. This vector can be derived from a combination of the switching states of the corresponding ones of the second field-effect transistors 50a-c, as shown in the center of FIG. 4A. The measurement of the values of the currents enables a substantially precise application of the voltage to the corresponding ones of the second field-effect transistors 50a-c.

The current measuring system of the present document can also be combined with a shunt measurement or can be used without external current measurement to obtain further information. Such further information comprises, for example, redundant measurements for the requirements of functional security of a chip or a more comprehensive coverage for diagnostic purposes.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

REFERENCE NUMERALS 10 system
20 motor
25 commutation block
30 bridge
32 high side
34 low side
40a-c first field-effect transistor
42a-c gate
50a-c second field-effect transistor
52a-c gate
60a-c current measuring circuit
65 line
70a-c pulse-width modulator
75 line
80 analog-digital converter
90 resistor
95 multiplexer
100 control

What is claimed is:

1. A current measuring system for a commutated motor, comprising:
   a bridge circuit with a plurality of parallel branches, wherein the branches are connected to commutation blocks of the commutated motor and have a first switching element in a high-side of the bridge circuit and a second switching element in a low-side of the bridge circuit, wherein one of the gates of the first switching element and one of the gates of the second switching element in the same branch are connected with one of a plurality of pulse-width modulators, and wherein the branches have a current measuring circuit, wherein the current measuring circuits are arranged in the high-side of the bridge circuit;
   an analog-digital converter connected via a line to the plurality of pulse-width modulators, the analog-digital converter being controlled by a trigger signal from the plurality of pulse-width modulators;
   a multiplexer, wherein the outputs of the current measuring circuits are connected to the analog-digital converter via lines and the multiplexer, and wherein the multiplexer is switched by a signal from the plurality of pulse-width modulators; and
   a control circuit for controlling the current measuring system, wherein the control circuit is connected with the plurality of pulse-width modulators.

2. The current measuring system according to claim 1, wherein the first switching elements are first field-effect transistors and the second switching elements are second field effect transistors.

3. A commutated motor with a current measuring system, the current measuring system comprising a plurality of parallel branches, wherein the branches are connected to commutation blocks of the commutated motor and have a first switching element in a high-side of the bridge circuit and a second switching element in a low-side of the bridge circuit, wherein one of the gates of the first switching element and one of the gates of the second switching element in the same branch are connected with one of a plurality of pulse-width modulators, and wherein the branches have a current measuring circuit, wherein the current measuring circuits are arranged in the high-side of the bridge circuit;
   an analog-digital converter connected via a line to the plurality of pulse-width modulators, the analog-digital converter being controlled by a trigger signal from the plurality of pulse-width modulators;
   a multiplexer, wherein the outputs of the current measuring circuits are connected to the analog-digital converter via lines and the multiplexer, and wherein the multiplexer is switched by a signal from the plurality of pulse-width modulators; and
   a control circuit for controlling the current measuring system, wherein the control circuit is connected with the plurality of pulse-width modulators.

4. A motor, comprising a plurality of commutation blocks, wherein each commutation block is connected to one of a plurality of current measuring circuits for capturing the current flow ($i_A$, $i_B$, $i_C$) in the connected commutation block, wherein the current measuring circuits are arranged in several branches of a current measuring system, wherein the several branches have a first switching element in a high-side of the bridge circuit and a second switching element in a low-side of the bridge circuit, wherein one of the gates of the first switching element and one of the gates of the second switching element in the same branch are connected with one of a plurality of pulse-width modulators; wherein an analog-digital converter connected via a line to the plurality of pulse-width modulators, the analog-digital converter being controlled by a trigger signal from the plurality of pulse-width modulators; wherein a multiplexer, wherein the outputs of the current measuring circuits are connected to the analog-digital converter via lines and the multiplexer, and wherein the multiplexer is switched by a signal from the plurality of pulse-width modulators; wherein a control circuit for controlling the current measuring system is connected with the plurality of pulse-width modulators, wherein the current measuring circuits are arranged in the high side of the bridge circuit.

5. A current measuring system for a commutated motor, comprising:
   a bridge circuit with a plurality of parallel branches, wherein the branches are connected to commutation blocks of the commutated motor and have a first switching element in a high-side of the bridge circuit and a second switching element in a low-side of the bridge circuit, wherein the first switching elements are first field-effect transistors and the second switching elements are second field effect transistors, wherein one of the gate of the first switching element and one of the gates of the second switching element in the same branch are connected with one of a plurality of pulse-width modulators, and wherein the branches have a current measuring circuit, wherein the current measuring circuits are arranged in the high-side of the bridge circuit;

an analog-digital converter connected via a line to the plurality of pulse-width modulators, the analog-digital converter being controlled by a trigger signal from the plurality of pulse-width modulators;

a multiplexer, wherein the outputs of the current measuring circuits are connected to the analog-digital converter via lines and the multiplexer, and wherein the multiplexer is switched by a signal from the plurality of pulse-width modulators; and a control circuit for controlling the current measuring system, wherein the control circuit is connected with the plurality of pulse-width modulators.

* * * * *